United States Patent
Higuchi et al.

(10) Patent No.: US 11,898,078 B2
(45) Date of Patent: Feb. 13, 2024

(54) SEMICONDUCTOR PHOSPHOR

(71) Applicant: SHIN-ETSU HANDOTAI CO., LTD., Tokyo (JP)

(72) Inventors: Susumu Higuchi, Annaka (JP); Kenji Sakai, Annaka (JP); Masato Yamada, Chiyoda-ku (JP); Masanobu Takahashi, Annaka (JP); Junya Ishizaki, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 923 days.

(21) Appl. No.: 16/762,963

(22) PCT Filed: Oct. 11, 2018

(86) PCT No.: PCT/JP2018/037844
§ 371 (c)(1),
(2) Date: May 11, 2020

(87) PCT Pub. No.: WO2019/093056
PCT Pub. Date: May 16, 2019

(65) Prior Publication Data
US 2020/0270518 A1 Aug. 27, 2020

(30) Foreign Application Priority Data
Nov. 9, 2017 (JP) .................. 2017-216085

(51) Int. Cl.
*C09K 11/70* (2006.01)
*C09K 11/08* (2006.01)
(Continued)

(52) U.S. Cl.
CPC ........ *C09K 11/706* (2013.01); *C09K 11/0883* (2013.01); *H01L 33/00* (2013.01); *C30B 25/183* (2013.01); *C30B 29/40* (2013.01)

(58) Field of Classification Search
CPC ... C09K 11/706; C09K 11/0883; H01L 33/00; C30B 25/183; C30B 29/40
See application file for complete search history.

(56) References Cited

U.S. PATENT DOCUMENTS

| | | |
|---|---|---|
| 2002/0167985 A1 | 11/2002 | Shinagawa et al. |
| 2004/0129891 A1 | 7/2004 | Takagi et al. |

(Continued)

FOREIGN PATENT DOCUMENTS

| | | |
|---|---|---|
| CN | 1934717 A | 3/2007 |
| CN | 1993807 A | 7/2007 |

(Continued)

OTHER PUBLICATIONS

Dec. 27, 2022 Office Action issued in Taiwanese Patent Application No. 107137165.

(Continued)

*Primary Examiner* — Mary Ellen Bowman
(74) *Attorney, Agent, or Firm* — Oliff PLC

(57) ABSTRACT

A semiconductor phosphor configured to exhibit photoluminescence upon irradiation with excitation light, including: at least one active layer made of a compound semiconductor and containing an n-type or p-type dopant; and at least two barrier layers made of a compound semiconductor and having a larger band gap than the active layer. The active layer and the barrier layers are alternately stacked. This provides a semiconductor phosphor which allows easy wavelength adjustment, high efficiency and stability.

6 Claims, 10 Drawing Sheets

(51) Int. Cl.
*H01L 33/00* (2010.01)
*C30B 25/18* (2006.01)
*C30B 29/40* (2006.01)

(56) References Cited

U.S. PATENT DOCUMENTS

| | | |
|---|---|---|
| 2006/0043356 A1 | 3/2006 | Kimura |
| 2007/0164304 A1 | 7/2007 | Takeuchi et al. |
| 2007/0296060 A1 | 12/2007 | Tanabe et al. |
| 2009/0180508 A1* | 7/2009 | Makita ............... H01S 5/4031 372/45.01 |
| 2009/0302308 A1 | 12/2009 | Chua et al. |
| 2010/0155761 A1* | 6/2010 | Ota .................. G02B 6/0073 257/E33.061 |
| 2010/0288998 A1 | 11/2010 | Kikuchi et al. |
| 2014/0048771 A1 | 2/2014 | Takahashi et al. |
| 2017/0353011 A1 | 12/2017 | Kawakita et al. |

FOREIGN PATENT DOCUMENTS

| | | |
|---|---|---|
| JP | H05-343734 A | 12/1993 |
| JP | H08-250815 A | 9/1996 |
| JP | 2003-249720 A | 9/2003 |
| JP | 2004-131567 A | 4/2004 |
| JP | 2004-200671 A | 7/2004 |
| JP | 2005-150627 A | 6/2005 |
| JP | 2006-041077 A | 2/2006 |
| JP | 2008-216146 A | 9/2008 |
| JP | 2009-081379 A | 4/2009 |
| JP | 2009-188372 A | 8/2009 |
| JP | 2010-504627 A | 2/2010 |
| WO | 2013/132812 A1 | 9/2013 |
| WO | 2016/143579 A1 | 9/2016 |

OTHER PUBLICATIONS

Mar. 1, 2023 Office Action issued in Chinese Patent Application No. 201880072592.4.
May 12, 2020 International Preliminary Report on Patentability issued in International Patent Application No. PCT/JP2018/037844.
Takashima, S. et al., "Effect of III-V on insulator structure on quantum well intermixing," Japanese Journal of Applied Physics, vol. 55, pp. 04EH13-1 to 04EH13-7, 2016.
Shuti, L. et al., "Effect of Si doping on the photoluminescence properties of AlGaInP/GaInP multiple quantum wells," Microelectronics Journal, vol. 38, pp. 767-770, 2007.
Tanaka, T. et al., "Ordered Structure in GaInP/AlGaInP Quantum Wells and p-Doped Multiquantum Well AlGaInP Laser Diodes," Materials Research Society Symposia Proceedings, vol. 240, pp. 253-258, 1992.
Jang, D-H., "Zn Induced Layer Disordering in GaInP/AlInP Visible Multi-Quantum Well Distributed Bragg Reflector Laser Diode," Japanese Journal of Applied Physics, vol. 32, Part 2, No. 5B, pp. L710-L712, May 15, 1993.
Jun. 4, 2019 Office Action issued in Japanese Patent Application No. 2017-216085.
Sep. 24, 2019 Office Action issued in Japanese Patent Application No. 2017-216085.
Jan. 8, 2019 International Search Report issued in International Patent Application No. PCT/JP2018/037844.
May 27, 2022 Office Action issued in Chinese Patent Application No. 201880072592.4.
Jul. 25, 2023 Office Action issued in Chinese Patent Application No. 201880072592.4 with partial translation.

* cited by examiner

[FIG. 1]
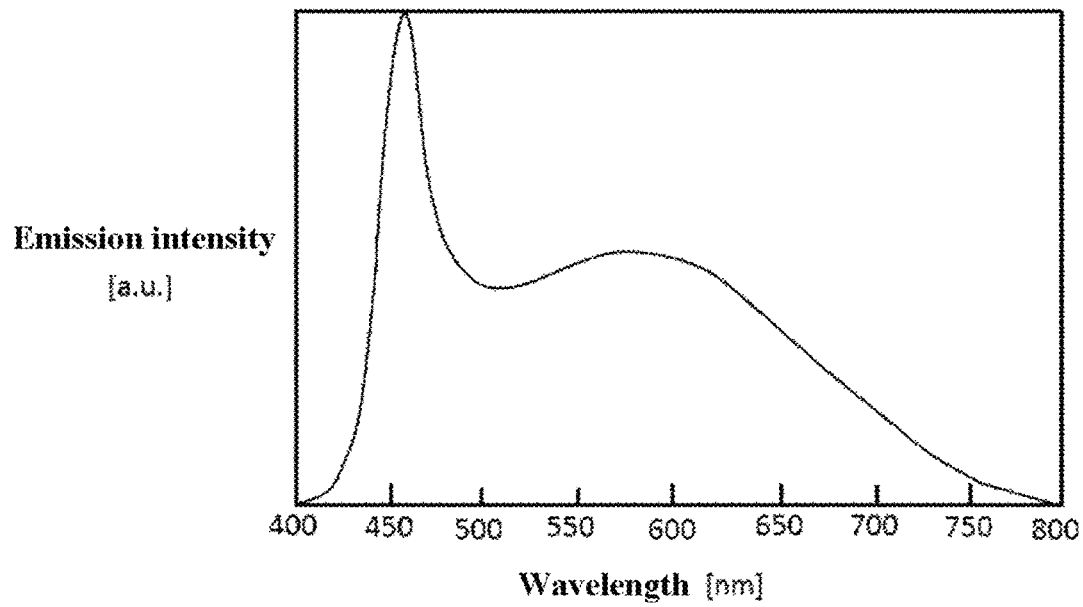
[FIG. 2]
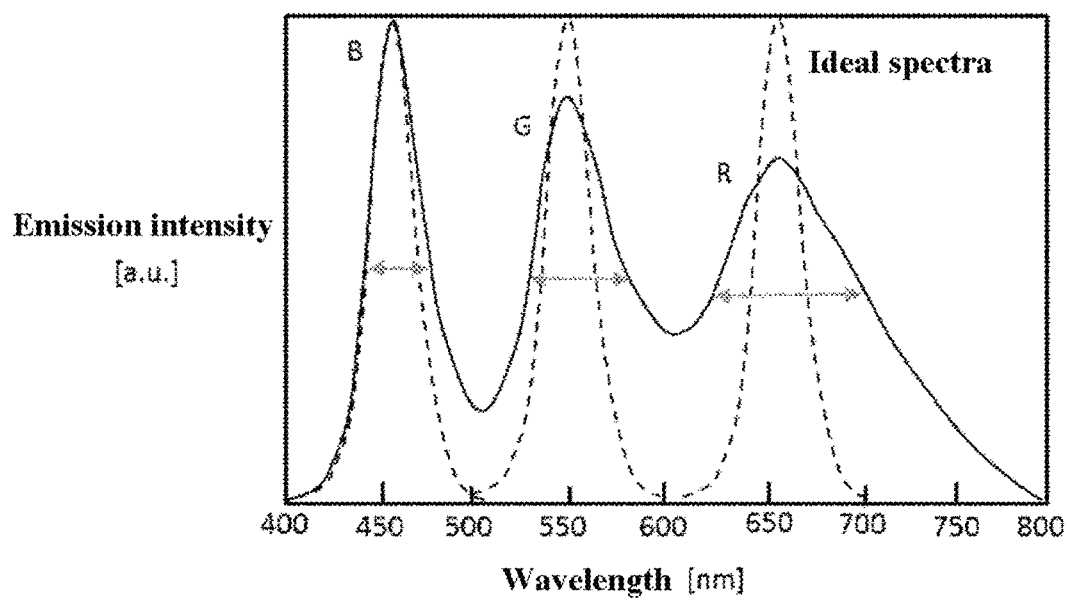

[FIG. 3]
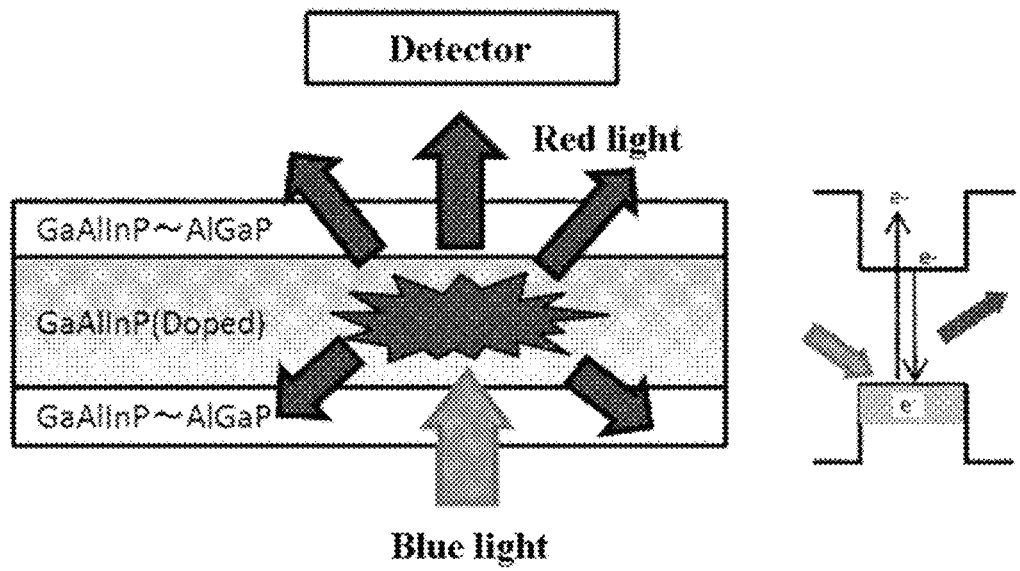
[FIG. 4]
Normal EL light emission (LED etc.)
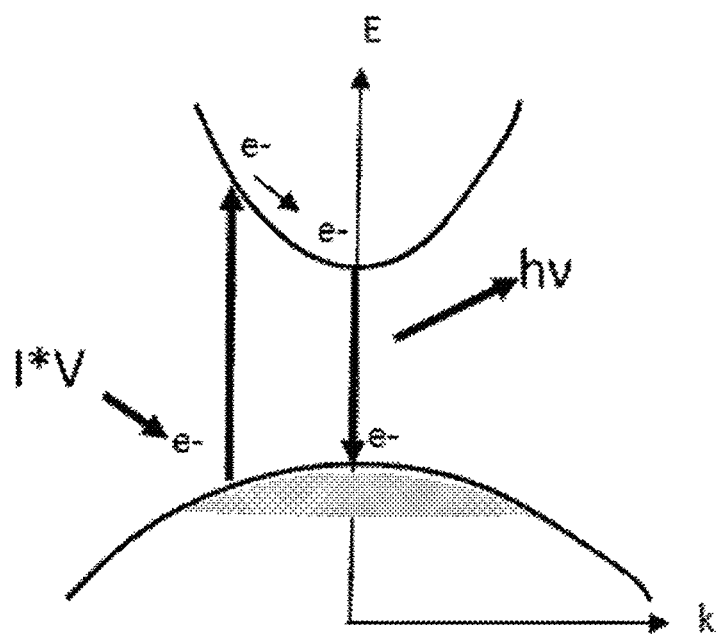

[FIG. 5]
PL light emission
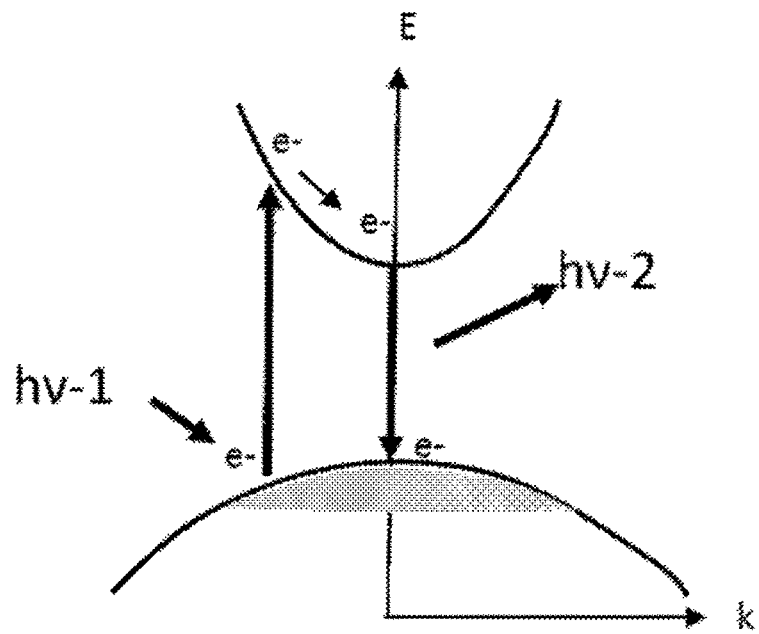
[FIG. 6]
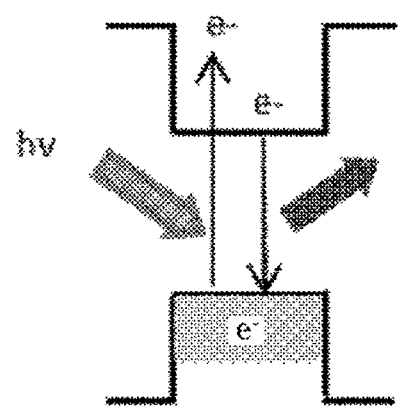
Bulk

[FIG. 7]
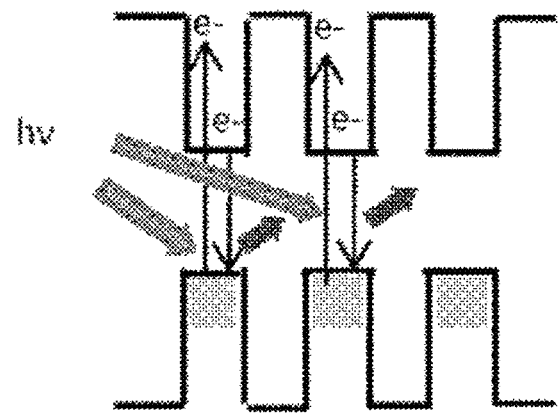
Multi
[FIG. 8]
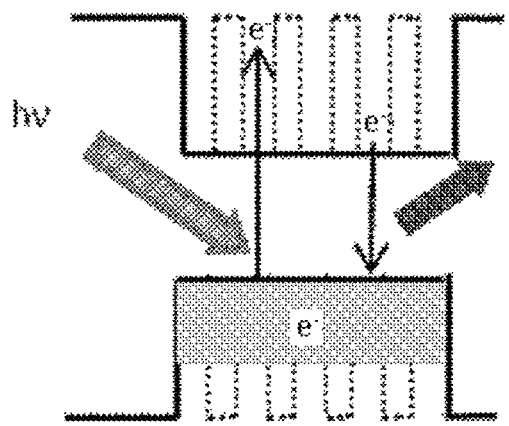
MQW

[FIG. 9]
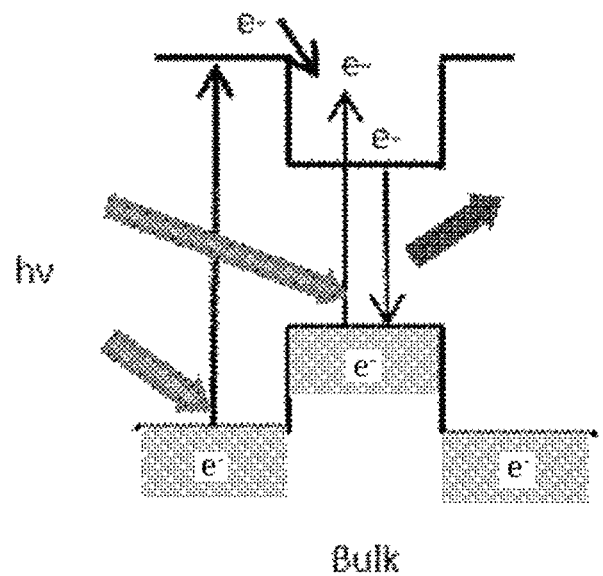
Bulk
[FIG. 10]
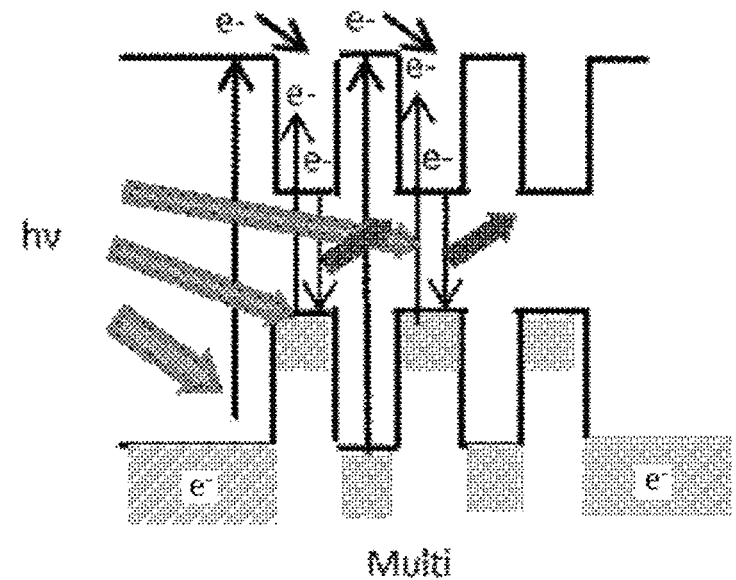
Multi

[FIG. 11]
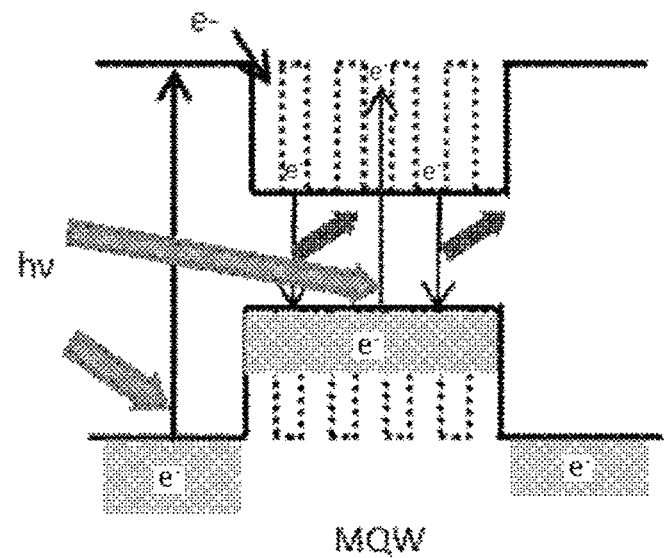
MQW
[FIG. 12]
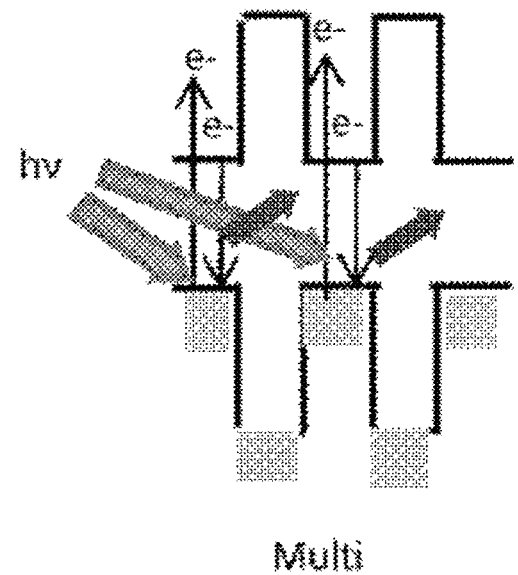
Multi

[FIG. 13]
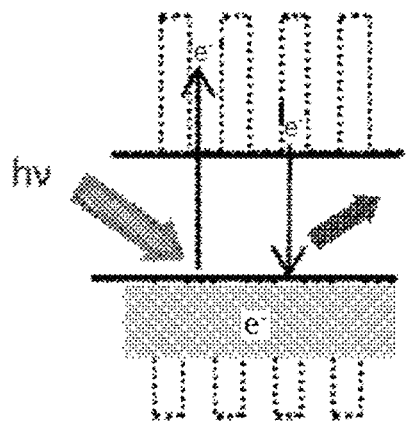
MQW
[FIG. 14]
| | Thickness [nm] | Dopant | Carrier concentration |
|---|---|---|---|
| AlInP-Clad | 50 | non | — |
| GaInP/AlInP MQW-type | AlInP-5.0 GaInP-5.0 ×40pair | Si | 3.5E17[/cm2] |
| AlInP-Clad | 50 | non | — |

[FIG. 15]
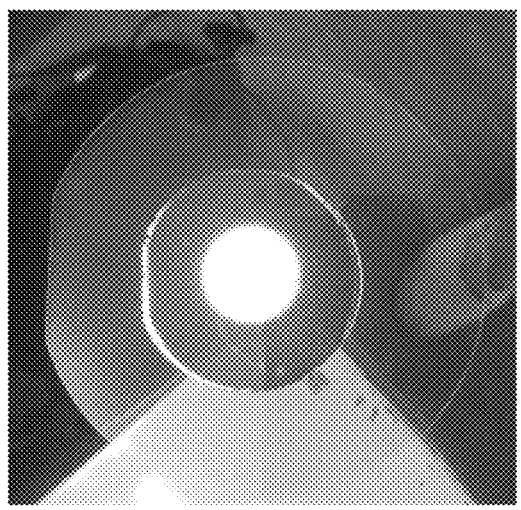 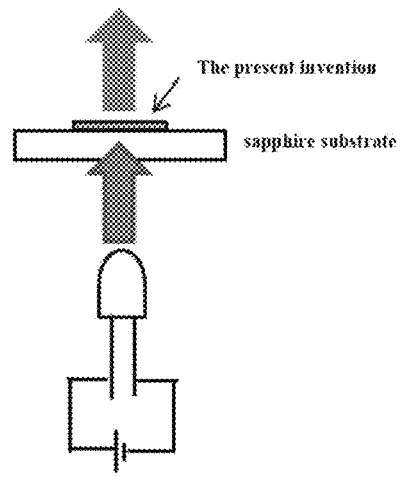
[FIG. 16]
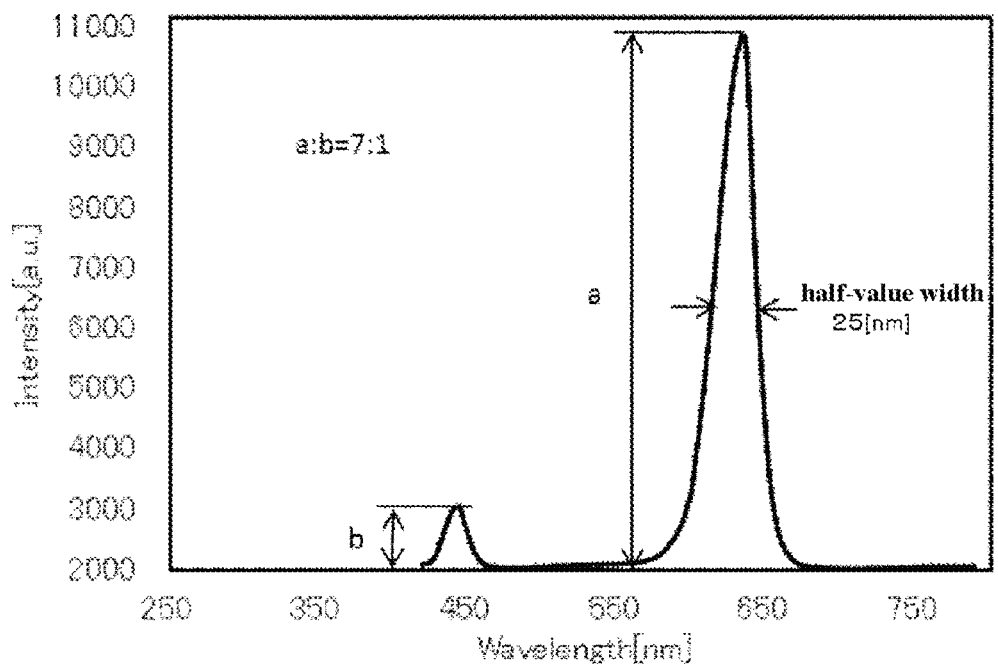

[FIG. 17]
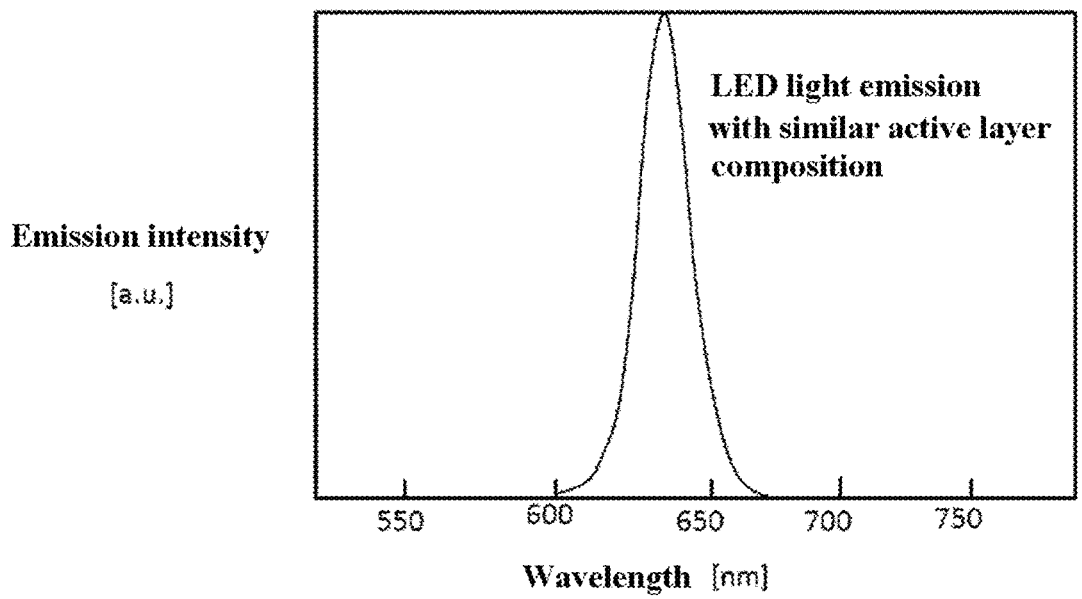
[FIG. 18]
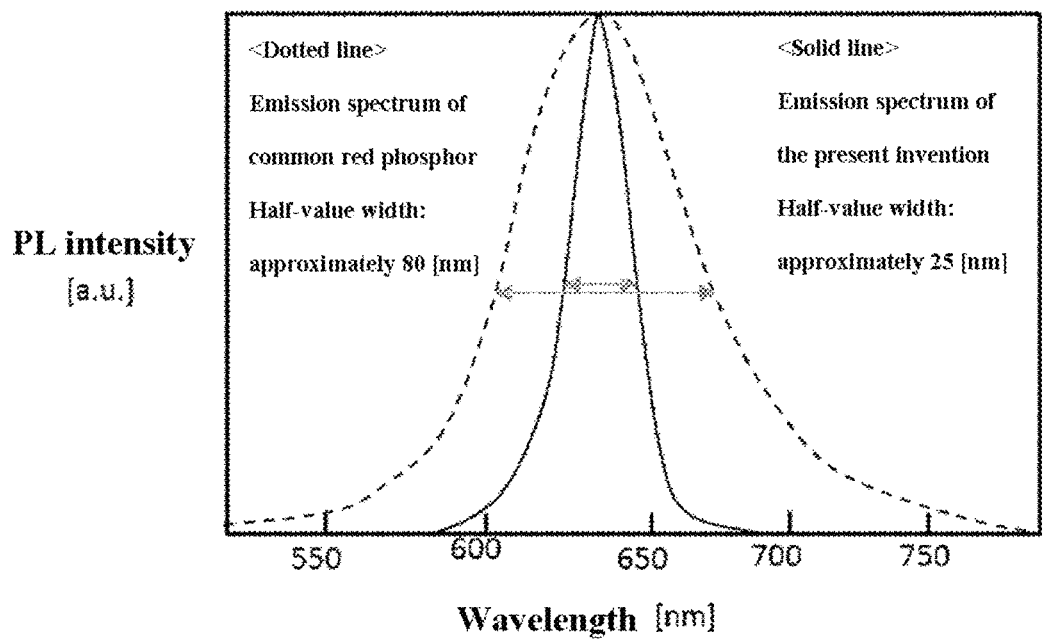

[FIG. 19]
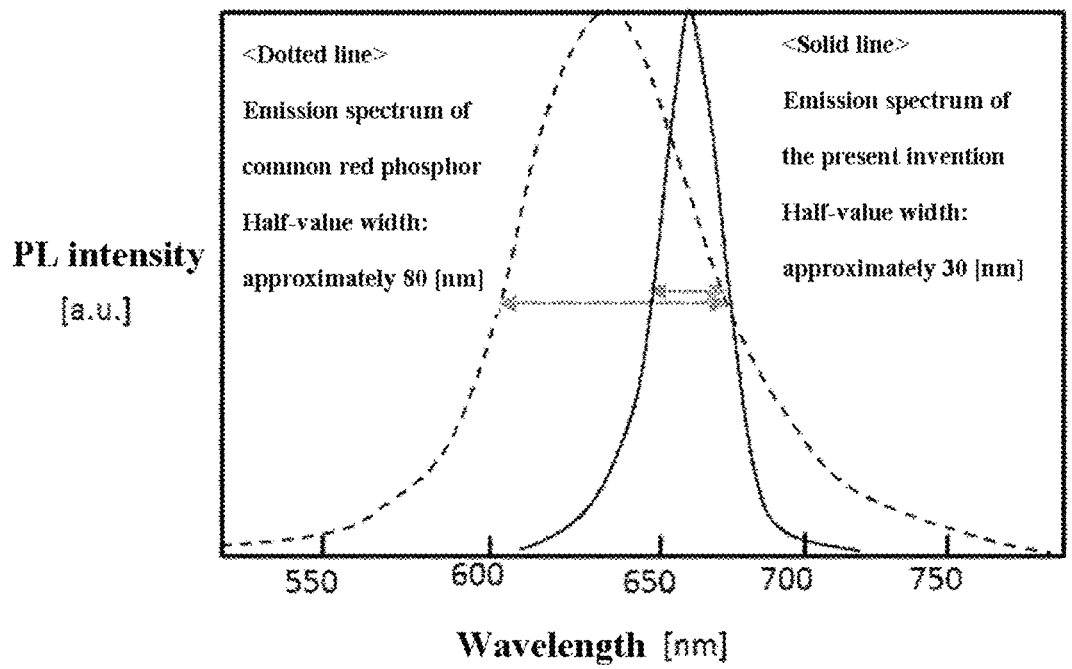

SEMICONDUCTOR PHOSPHOR

TECHNICAL FIELD

The present invention relates to a semiconductor phosphor for changing light wavelength, particularly a semiconductor phosphor for efficiently changing the color of blue light to red.

BACKGROUND ART

Generally, phosphors used in white LEDs include YAG type and SiAlON type. However, conventional phosphors inevitably emit blue-dominant light even when the wavelength of blue light is changed in white-LED preparations (FIG. 1). As red phosphors, nitrides such as CASN have been practically used, but have problems with production of RGB-based white LEDs because the waveform of emission light is relatively broad and it is difficult to control the wavelength. When RGB-based white LEDs with high color rendering properties are produced, the emission spectra of the phosphors are desirably narrow. However, ordinary phosphors emit light with particularly wide red spectra, and there is room for improvement (FIG. 2). Incidentally, this problem is common among present phosphors regardless of the wavelength regions (blue, green, red) of the phosphors.

Moreover, recently, Quantum Dot and so forth have been studied. However, when wavelength is changed by the quantum size effects of Quantum Dot and so forth, the size dependency is large and it is difficult to control the fluorescent wavelength. Hence, with the present technology, potentially considerable improvement is expected from phosphors, particularly phosphors for near red regions.

Moreover, Patent Document 1 proposes the use of a phosphor in which compound semiconductors are stacked. This phosphor is constituted of a fluorescent layer and a light excitation layer having a dopant. The light excitation layer absorbs light, and the fluorescent layer emits light. However, since the light-receiving part and the light-emitting part are separate, the light emission efficiency is not sufficient.

CITATION LIST

Patent Literature

Patent Document 1: Japanese Unexamined Patent Application Publication No. 2006-41077

SUMMARY OF INVENTION

Technical Problem

The present invention has been made in view of the above-described problems. An object of the present invention is to provide a semiconductor phosphor which allows easy wavelength adjustment, high efficiency and stability.

Solution to Problem

To achieve the object, the present invention provides a semiconductor phosphor configured to exhibit photoluminescence upon irradiation with excitation light, comprising:
    at least one active layer made of a compound semiconductor and containing an n-type or p-type dopant; and
    at least two barrier layers made of a compound semiconductor and having a larger band gap than the active layer, wherein the active layer and the barrier layers are alternately stacked.

With such a semiconductor phosphor, for example, when the color of blue light is changed to red, the wavelength changing efficiency is high and a sharp emission spectrum can be obtained in comparison with conventional YAG-based, SiAlON-based, and other phosphors.

Moreover, each of the compound semiconductors is preferably a group III-V compound semiconductor.

In this case, the group III-V compound semiconductor is preferably a compound semiconductor having a composition formula of $(Al_xGa_{1-x})_yIn_{1-y}P$, wherein $0 \leq x \leq 1$ and $0 \leq y \leq 1$.

Such semiconductor phosphors can be reliably a semiconductor phosphor exhibiting a high changing efficiency.

Moreover, the semiconductor phosphor preferably comprises a multiple quantum well structure in which the active layer and the barrier layers are alternately stacked.

Such a semiconductor phosphor can further enhance the changing efficiency.

Advantageous Effects of Invention

As described above, the inventive semiconductor phosphor makes it possible to provide a semiconductor phosphor which allows easy wavelength adjustment, high efficiency and stability.

BRIEF DESCRIPTION OF DRAWINGS

FIG. 1 shows an example of an emission spectrum of a white LED prepared using a conventional phosphor.

FIG. 2 shows a comparison between ideal spectra of colors sought for RGB-based white LEDs and an example of a spectrum of a conventional phosphor.

FIG. 3 shows conceptual diagrams for explaining the inventive semiconductor phosphor.

FIG. 4 is a conceptual diagram for explaining EL (electroluminescence)-based light emission.

FIG. 5 is a conceptual diagram for explaining PL (photoluminescence)-based light emission.

FIG. 6 is a conceptual diagram for explaining the operation principle when the inventive semiconductor phosphor has a monolayer.

FIG. 7 is a conceptual diagram for explaining the operation principle when the inventive semiconductor phosphor has a multilayer.

FIG. 8 is a conceptual diagram for explaining the operation principle when the inventive semiconductor phosphor has an MQW (multiple quantum well structure).

FIG. 9 is a conceptual diagram for explaining the operation principle when the inventive semiconductor phosphor has a monolayer and the barrier layers are also doped.

FIG. 10 is a conceptual diagram for explaining the operation principle when the inventive semiconductor phosphor has a multilayer and the barrier layers are also doped.

FIG. 11 is a conceptual diagram for explaining the operation principle when the inventive semiconductor phosphor has an MQW (multiple quantum well structure) and the barrier layers are also doped.

FIG. 12 is a conceptual diagram for explaining the operation principle when the inventive semiconductor phosphor has a multilayer in which barrier layers on both sides are eliminated.

FIG. 13 is a conceptual diagram for explaining the operation principle when the inventive semiconductor phosphor has an MQW (multiple quantum well structure) in which barrier layers on both sides are eliminated.

FIG. 14 is a schematic diagram of semiconductor phosphors prepared in Examples 1 and 2.

FIG. 15 shows a diagram for explaining the emission-spectrum measurement principle and an exemplar photograph showing a luminous state in Examples and Comparative Example.

FIG. 16 is an emission spectrum observed in Example 1.

FIG. 17 is an LED emission spectrum of a semiconductor having a similar active layer composition to that in Example 1.

FIG. 18 shows the emission spectrum obtained in Comparative Example 1 superimposed on the emission spectrum obtained in Example 1.

FIG. 19 shows an emission spectrum obtained in Example 2 superimposed on the emission spectrum obtained in Comparative Example 1.

DESCRIPTION OF EMBODIMENTS

As described above, there have been demands for the development of a semiconductor phosphor which allows easy wavelength adjustment, high efficiency and stability.

The present inventors have earnestly studied and consequently found that a sharper emission spectrum than those of conventional phosphors is obtained by applying PL (photoluminescence) of the semiconductor as shown in FIG. 3 to construct a structure adapted for PL light emission to function as a phosphor, instead of constructing a structure adapted for EL (electroluminescence) when a semiconductor is used for LED. Then, the inventors have further earnestly studied more efficient structures and completed the present invention.

Specifically, the present invention is a semiconductor phosphor configured to exhibit photoluminescence upon irradiation with excitation light, comprising:
  at least one active layer made of a compound semiconductor and containing an n-type or p-type dopant; and
  at least two barrier layers made of a compound semiconductor and having a larger band gap than the active layer, wherein
  the active layer and the barrier layers are alternately stacked.

Hereinafter, the present invention will be described in detail, but the present invention is not limited thereto.

External quantum efficiency which represents the light emission efficiency of LED can be shown by the following equation, for example.

$$\eta \text{ (External quantum efficiency)} = \eta\text{inj (injection efficiency)} \times \eta\text{int (internal quantum efficiency)} \times \eta\text{ext (light extraction efficiency)}$$

Normally, in LED, the energy source of the Input is current, and a p-n junction is formed to increase the injection efficiency ($\eta$inj) and exhibit electroluminescence (FIG. 4). In contrast, in the present invention, a semiconductor multilayer structure is prepared, and $\eta$inj is increased by light in place of current to exhibit photoluminescence (FIG. 5). This enables more efficient change in light wavelength than with conventional phosphors.

The inventive semiconductor phosphor includes at least one active layer containing an n-type or p-type dopant, and at least two barrier layers having a larger band gap than the active layer. The active layer and the barrier layers are alternately stacked. Additionally, a multiple quantum well structure can be formed by stacking several to several tens of active layers and barrier layers. Further, such a laminate of the active and barrier layers can be sandwiched by undoped cladding layers. Furthermore, the inventive semiconductor phosphor may be structured such that it is bonded to a support substrate, for example, a transparent sapphire substrate etc.

In the present invention, the semiconductor used for the active layer(s) and the barrier layers may be a group III-V compound semiconductor having a composition formula of $(Al_xGa_{1-x})_yIn_{1-y}P$, where $0 \le x \le 1$ and $0 \le y \le 1$. Note that the semiconductor is more preferably a compound semiconductor having a composition formula of $(Al_xGa_{1-x})_yIn_{1-y}P$, where $0 \le x \le 0.6$ and $0.4 < y < 0.6$. In addition, each barrier layer preferably has a higher Al content than the active layer.

As a feature of the present invention, the wavelength of emitted light can be easily changed by changing the Matrix material and structure. Moreover, an AlGaInP material is preferable in targeting the red region, which is potentially improved to a considerable extent. Alternatively, other materials that can fabricate LEDs may also be used to produce phosphors for other wavelength regions (near green or near blue, for example, using GaN based materials).

The active layer used in the inventive semiconductor phosphor contains an n-type or p-type dopant. The type of the dopant is not particularly limited. As the n-type dopant, for example, Si can be used. As the p-type dopant, for example, Mg and Zn can be used. Additionally, the dopant concentration is preferably no less than $1.0 \times 10^{16}$ atoms/cm$^3$. Further, the barrier layer may also contain a dopant as described above.

In the inventive semiconductor phosphor, since the active layer contains a dopant, the light-receiving layer and the light-emitting layer are the same. In other words, light is received and emitted at the same portion, so that excited carriers are efficiently generated. Further, by being sandwiched between the aforementioned cladding layers, light and carriers (electrons and holes) are more reliably trapped, and the luminous efficiency can be further improved.

The inventive semiconductor phosphor has at least one active layer and at least two barrier layers, and the active and barrier layers are alternately stacked. The thickness of the active layer is not particularly limited, but is preferably 0.003 to 2.0 μm. The thickness of the barrier layer is not particularly limited, either, but is preferably 0.003 to 2.0 μm. The layers are stacked as described above to form a well layer, which traps generated charges without causing overflow and enables the efficient changing. Further, the changing efficiency can be further enhanced with a multiple quantum well structure formed by stacking several to several tens of the active layers and barrier layers each having a thickness of several tens of nm or less.

In the inventive semiconductor phosphor, for example, the active layer and the barrier layers may be sandwiched by 0.03- to 4.0-μm undoped cladding layers. Moreover, the inventive semiconductor phosphor may have a structure that is bonded to, for example, a transparent sapphire substrate or the like as a support substrate.

As described above, in the inventive semiconductor phosphor, the light-emitting layer can be easily modified to a monolayer, a multilayer, or an MQW (multiple quantum well structure). Thus, these structures can be selected freely (FIGS. 6 to 8). In addition, both the active layer and the barrier layer may be doped as described above to utilize both of charge transfer in the real space and excitation→light emission in the well layer (FIGS. 9 to 11). Further, in the cases of multilayer and MQW structure, since the active layer originally has an effect of trapping charges and light, the barrier layer(s) on one side or both sides at an end(s) of the laminate of the active layers and the barrier layers may be eliminated to suppress light absorption and increase the injection efficiency of excitation light. FIGS. 12 and 13 show examples of the multilayer and MQW structure where the barrier layers on both sides are eliminated. In this case also, the active layer and the barrier layers are alternately stacked and fall within the scope of the present invention.

The inventive semiconductor phosphor can be produced basically by the same methods for light-emitting devices, and can be fabricated also by an MOVPE method, which is currently the mainstream for production of epitaxial wafers for LEDs, etc. Alternatively, the inventive semiconductor phosphor can be fabricated also by an MBE method based on the structure. Hereinafter, an exemplar production method according to the MOVPE method will be described.

As a growth substrate, a GaAs substrate is prepared, washed, and then put into an MOVPE apparatus. Onto the GaAs substrate, a GaAs buffer layer is epitaxially grown to 0.1 to 1.0 μm. Subsequently, onto the GaAs buffer layer, an undoped cladding layer made of $(Al_xGa_{1-x})_yIn_{1-y}P$ with a thickness of 0.03 to 4.0 μm is epitaxially grown. Thereafter, an active layer made of $(Al_xGa_{1-x})_yIn_{1-y}P$ with a thickness of 0.003 to 2.0 μm and a barrier layer made of $(Al_{x''}Ga_{1-x''})_{y''}In_{1-y''}P$ with a thickness of 0.003 to 2.0 μm are alternately stacked thereon by epitaxial growth. The active layer is one or more layers, and the barrier layer is two or more layers. Alternatively, these thicknesses may be several tens of nm or less, and several to several tens of these layers may be stacked to form a multiple quantum well structure. Then, an undoped cladding layer made of $(Al_xGa_{1-x})_yIn_{1-y}P$ with a thickness 0.03 to 4.0 μm is epitaxially grown thereon.

Incidentally, the epitaxial growth of each layer can be carried out by a known MOVPE method. Examples of raw-material gases serving as component sources of Al, Ga, In, and P include, but are not limited to, the following.

Al source gas: trimethylaluminum (TMAl), triethylaluminum (TEAl), etc.
Ga source gas: trimethylgallium (TMGa), triethylgallium (TEGa), etc.
In source gas: trimethylindium (TMIn), triethylindium (TEIn), etc.
P source gas: trimethylphosphorus (TMP), triethylphosphorus (TEP), phosphine (PH3), etc.

Moreover, as the dopant gas, it is possible to use the following.
(p-type Dopant)
Mg source: bis(cyclopentadienyl)magnesium (Cp2Mg), etc.
Zn source: dimethylzinc (DMZn), diethylzinc (DEZn), etc.
(n-type Dopant)
Si source: silicon hydrides such as monosilane, etc.

From the MOVPE apparatus, the substrate is taken out with the above-described layers stacked thereon. The GaAs substrate and the GaAs buffer layer are removed by chemical etching. Then, for example, a sapphire substrate is bonded onto the cladding layer with an adhesive agent. Thus, a semiconductor phosphor can be produced. Alternatively, without adhering to the sapphire substrate, the phosphor may be subjected to crushing or the like and used in the form of fine particles. It should be noted that the present invention is utilized in other compound semiconductors (such as GaN in the group III-V, ZnO in the group II-VI, and the like) which enable laminating a photoluminescence active layer and barrier layers.

EXAMPLE

Hereinafter, the present invention will be specifically described with reference to Examples and Comparative Examples. However, the present invention is not limited thereto.

Example 1

Targeting the red region, an AlGaInP multilayer thin film shown in FIG. 14 was grown on a GaAs substrate by using an MOVPE apparatus according to the same procedure for common LED crystals. The layer for PL light emission was an MQW of GaInP (well layer)/AlInP (barrier layer), and the target wavelength was 635 [nm] at the peak wavelength. The dopant was Si with a carrier concentration of 3.5E17 [/cm$^3$]. Then, the GaAs substrate was removed by chemical etching because the target wavelength and equivalent wavelengths are absorbed otherwise. Subsequently, the grown multilayer thin film was bonded to a sapphire substrate with an adhesive agent. Thus, a semiconductor phosphor was obtained. The obtained semiconductor phosphor had a multiple quantum well structure which had 40 pairs of active layers each made of GaInP with a thickness of 5 nm and barrier layers each made of AlInP with a thickness 5 nm, and which was sandwiched by undoped cladding layers each made of AlInP with a thickness of 50 nm. The active layers and the barrier layers contained an n-type dopant (Si) at $3.5 \times 10^{17}$ atoms/cm$^3$.

The above semiconductor phosphor was irradiated with blue LED (λp=450 [nm]), and the emission spectrum was measured at the back surface in relation to the irradiation direction. FIG. 15 shows a photograph taken during the light emission, and the measurement principle.

Comparative Example 1

A red phosphor having substantially the same peak wavelength as the semiconductor phosphor in Example 1 was also irradiated with blue LED (λp=450 [nm]), and the emission spectrum was measured at the back surface in relation to the irradiation direction.

In Example 1, the obtained emission spectrum had a sharp waveform and a high intensity at λp=635 [nm] with a half-value width of approximately 25 [nm] as shown in FIG. 16. Moreover, the blue spectrum was substantially absorbed, and the peak ratio to the emission spectrum was 7:1. Further, this emission spectrum was almost identical to the LED emission spectrum, which is shown in FIG. 17, of the semiconductor having a similar active layer composition to that in the semiconductor phosphor of Example 1. Furthermore, in Comparative Example 1, the spectrum of the red phosphor having substantially the same peak wavelength as the semiconductor phosphor of Example 1 had a half-value width of approximately 80 [nm] (FIG. 18). This indicates that quite a sharp spectrum is obtained from the inventive semiconductor phosphor.

Example 2

Further, a semiconductor phosphor was prepared by the same method as in Example 1, except that the composition of the active layer was changed so as to emit light with a longer wavelength. The emission spectrum was measured. As a result, the half-value width was approximately 30 [nm] as shown in FIG. 19 and slightly increased in comparison with the semiconductor phosphor of Example 1, but the obtained emission spectrum was sharp at λp=660 [nm]. Thus, as a feature of the present invention, the wavelength can be changed exactly in the same manner as in ordinary LEDs.

From the foregoing, according to the present invention, as shown in FIG. 18, the phosphor with quite a sharp half-value width was successfully obtained. Thus, the ideal RGB spectrums shown in FIG. 2 can be obtained. It has been revealed that the present invention makes is possible to provide a semiconductor phosphor which allows easy wavelength adjustment, high efficiency and stability.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A semiconductor phosphor configured to exhibit photoluminescence upon irradiation with excitation light, comprising:

at least one active layer made of a compound semiconductor and containing an n-type or p-type dopant; and at least two barrier layers made of a compound semiconductor and having a larger band gap than the active layer, wherein the active layer and the barrier layers are alternately stacked.

2. The semiconductor phosphor according to claim 1, wherein each of the compound semiconductors is a group III-V compound semiconductor.

3. The semiconductor phosphor according to claim 2, wherein the group III-V compound semiconductor is a compound semiconductor having a composition formula of $(Al_xGa_{1-x})_yIn_{1-y}P$, where $0 \leq x \leq 1$ and $0 \leq y \leq 1$.

4. The semiconductor phosphor according to claim 1, comprising a multiple quantum well structure in which the active layer and the barrier layers are alternately stacked.

5. The semiconductor phosphor according to claim 2, comprising a multiple quantum well structure in which the active layer and the barrier layers are alternately stacked.

6. The semiconductor phosphor according to claim 3, comprising a multiple quantum well structure in which the active layer and the barrier layers are alternately stacked.

\* \* \* \* \*